United States Patent [19]

Nishioka et al.

[11] Patent Number: 4,497,888

[45] Date of Patent: Feb. 5, 1985

[54] LIGHT-SENSITIVE O-QUINONEDIAZIDE PRINTING PLATE WITH OXONOL DYE

[75] Inventors: Akira Nishioka, Shizuoka; Yoshimasa Aotani, Kanagawa; Kotaro Yamasue, Shizuoka, all of Japan

[73] Assignee: Fuji Photo Film Co., Ltd., Kanagawa, Japan

[21] Appl. No.: 506,268

[22] Filed: Jun. 21, 1983

[30] Foreign Application Priority Data

Jun. 23, 1982 [JP] Japan .............................. 57-107996

[51] Int. Cl.³ .................. G03C 1/60; G03C 1/94; G03F 7/08

[52] U.S. Cl. .................................... 430/165; 430/190; 430/191; 430/192; 430/278; 430/302; 430/512; 430/522; 430/592

[58] Field of Search ............... 430/165, 191, 190, 522, 430/512, 302, 178

[56] References Cited

U.S. PATENT DOCUMENTS

| | | | |
|---|---|---|---|
| 3,458,311 | 7/1969 | Alles | 430/306 |
| 3,619,194 | 11/1971 | Mitchell | 430/507 |
| 3,859,099 | 1/1975 | Petropoulos et al. | 430/191 |
| 3,865,817 | 2/1975 | Kobayashi et al. | 430/522 |
| 3,891,516 | 6/1975 | Chu | 430/302 |
| 4,115,128 | 9/1978 | Kita | 430/191 |
| 4,266,014 | 5/1981 | Moelants et al. | 430/522 |
| 4,288,534 | 9/1981 | Lemahieu et al. | 430/522 |
| 4,399,210 | 8/1983 | Nagano et al. | 430/191 |

Primary Examiner—Charles L. Bowers, Jr.
Attorney, Agent, or Firm—Sughrue, Mion, Zinn, Macpeak and Seas

[57] ABSTRACT

A light-sensitive printing plate precursor is disclosed. The printing plate precursor is comprised of an aluminum support base having provided on a grained and anodized surface. The surface is coated with a layer which is comprised of a positive working light-sensitive composition and an oxonol dye. The printing plate has high printing durability, high water retention ability and high color stain resistance. When used the plate precursor provides an image having high contrast. The plate precursor forms less color stain than conventional plates whether used with a fresh developing solution or a fatigued developing solution. The plate precursor does not result in causing uneven development when using manual development methods.

6 Claims, No Drawings

LIGHT-SENSITIVE O-QUINONEDIAZIDE PRINTING PLATE WITH OXONOL DYE

FIELD OF THE INVENTION

This invention relates to a light-sensitive printing plate precursor capable of giving an image with less color stain and higher contrast after development, which comprises a previously grained and anodized aluminum support having coated thereon a layer of a positive working light-sensitive composition containing an oxonol dye.

BACKGROUND OF THE INVENTION

Photo-solubilizable compositions comprising an o-quinonediazide compound and a novolak resin provide such an excellent performance that they have been widely used industrially for producing lithographic printing plates or photoresists. However, the photo-solubilizable composition is not desirable because the o-quinonediazide compound, which itself appears yellowish, is photodecomposed by exposure to a colorless compound to give a visible image with a low contrast. Further, the resulting image cannot be visually recognized under a yellow safe lamp employed in actual exposing procedure, and such a composition provides such a low image contrast after development that inking is required in plateinspecting procedures such as erasing procedure.

With respect to this point, it is known to add, to the photo-solubilizable composition, a compound which undergoes photolysis upon exposure to produce an acidic substance and an organic dye which mutually acts with the photolysis-produced acidic substance to undergo change in color. Useful substances capable of producing an acidic substance by photolysis are disclosed in the following: U.S. Pat. No. 3,969,118 proposes o-naphthoquinonediazide-4-sulfonic acid halides, U.S. Pat. No. 4,160,671 proposes trihalomethyl-2-pyrrones and trihalomethyltriazines, British Pat. No. 2,038,801 proposes various o-naphthoquinonediazide compounds, and U.S. Pat. No. 4,279,982 proposes 2-trihalomethyl-5-aryl-1,3,4-oxadiazole compounds and, as the organic dye which mutually acts with photolysis products of these substances, diphenylmethane type, triphenylmethane type, thiazine type, oxazine type, phenazine type, xanthene type, anthraquinone type, iminonaphthoquinone type, and azomethine type dyes are shown.

Examples of these dyes are: Brilliant Green, Eosine, Ethyl Violet, Erythrosine B, Methyl Green, Crystal Violet, Basic Fuchsine, phenolphthalein, 1,3-diphenyltriazine, Alizarine Red S, Thymolphthalein, Methyl Violet 2B, Quinaldine Red, Rose Bengale, Metanil Yellow, Thymolsulfophthalein, Xylenol Blue, Methyl Orange, Orange IV, diphenylthiocarbazone, 2,7-dichlorofluoresceine, Paramethyl Red, Congo Red, Benzopurpurin 4B, α-Naphthyl Red, Nile Blue 2B, Nile Blue A, phenacetaline, Methyl Violet, Malachite Green, Parafuchsine, Oil Blue #603 (made by Orient Kagaku Kogyo Kabushiki Kaisha), Oil Pink #312 (made by Orient Kagaku Kogyo Kabushiki Kaisha), Oil Red 5B (made by Orient Kagaku Kogyo Kabushiki Kaisha), Oil Scarlet #308 (made by Orient Kagaku Kogyo Kabushiki Kaisha), Oil Red OG (made by Orient Kagaku Kogyo Kabushiki Kaisha), Oil Red RR (made by Orient Kagaku Kogyo Kabushiki Kaisha), Oil Green #502 (made by Orient Kagaku Kogyo Kabushiki Kaisha), Spiron Red BEH Special (made by Hodogaya Chemical Co., Ltd.), m-cresol purple, Cresol Red, Rhodamine B, Rhodamine 6G, Fast Acid Violet R, Sulforhodamine B, Auramine, 4-p-diethylaminophenyliminonaphthoquinone, 2-carboxyanilino-4-p-diethylaminophenyliminonaphthoquinone, 2-carbostearylamino-4-p-dihydroxyethylaminophenyliminonaphthoquinone, p-methoxybenzoyl-p'-diethylamino-o'-methylphenyliminoacetanilide, cyano-p-diethylaminophenyliminoacetanilide, 1-phenyl-3-methyl-4-p-diethylaminophenylimino-5-pyrazolone, 1-β-naphthyl-4-p-diethylaminophenylimino-5-pyrazolone, etc.

In recent printing plates, previously grained and anodized aluminum supports have come into use for the purpose of attaining longer press life, high water retention, high color stain resistance, etc. However, when a photo-solubilizable composition comprising an o-quinonediazide compound and a novolak resin and containing the aforesaid dye capable of mutually acting with the photolysis product is coated on the anodized aluminum support, the following defects arise. That is, the added dye is so strongly adsorbed on an oxide film formed on the support that it cannot be completely removed after exposure and development processing, with part of it remaining as color stain, resulting in insufficient image contrast after development processing. Therefore, fine images, for example, several % minimum dots, film edge, image of refuse depositing on printer film upon printing, etc., become obscure. Particularly, film edge and deposited refuse form images unnecessary for printing, and hence they must be removed. However, special addition of the dye for raising image contrast is not effective due to the color stain, thus inking is required.

In addition, development processing is conducted in some cases with a fresh developing solution having high developing power, and in other cases with a fatigued developing solution having deteriorated developing power. In many cases, color stain tends to become stronger when development is conducted with a fatigued developing solution than when conducted with a fresh developing solution. With some dyes, however, both fresh developing solution and fatigued developing solution bring about strong color stain. Recently, development processing has been conducted in an automatic developing machine, but some users still conduct development processing manually. In manual development processing, areas where a developing solution is dropped are processed with a fresh developing solution, but areas where a developing solution is spread by sponge are developed with a fatigued developing solution. Accordingly, where a fatigued solution brings about stronger color stain than a fresh solution does, manual development processing results in uneven color stain.

SUMMARY OF THE INVENTION

It is, therefore, an object of the present invention to provide a positive working lithographic printing plate precursor to form a positive working lithographic printing plate having high printing durability, high water retention, and high color stain resistance and which provides high image contrast.

Another object of the invention is to provide a positive working lithographic printing plate precursor which forms less color stain regardless of whether developed with a fresh developing solution or with a fatigued developing solution.

A further object of the present invention is to provide a positive working lithographic printing plate precursor which does not cause uneven development in manual development.

As a result of intensive investigations to attain the above-described objects, the inventors have found that the objects can be attained by coating an oxonol dye-containing, positive working light-sensitive composition on a previously grained and anodized aluminum support.

DETAILED DESCRIPTION OF THE INVENTION

Preferable examples of the oxonol dyes to be used in the present invention are those represented by the following general formula (I):

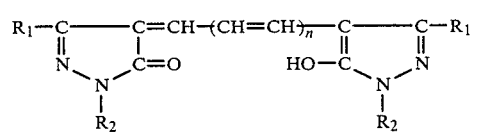

wherein $R_1$ and $R_2$, which may be the same or different, each represents a hydrogen atom or a monovalent group selected from the group consisting of an optionally substituted aryl group, and optionally substituted lower alkyl group, an optionally substituted alkoxycarbonyl group, and a carboxy group, and n represents 1 or 2.

$R_1$ and $R_2$ each includes preferably a hydrogen atom, a methyl group, an ethyl group, a cyanoethyl group, a carboxy group, a methoxycarbonyl group, an ethoxycarbonyl group, a phenyl group, an o-chlorophenyl group, a methachlorophenyl group, a p-sulfophenyl group.

Since these oxonol dyes undergo change in color tone by mutual action with an acidic substance, visual images with sufficient contrast can be obtained immediately after exposure by adding a compound capable of being photodecomposed to produce an acidic substance.

The process for producing a lithographic printing plate precursor in accordance with the present invention will be successively described in detail below.

The aluminum plate to be used in the present invention includes a pure aluminum plate and an aluminum alloy plate. Various aluminum alloys may be used such as an alloy of aluminum with any of silicon, copper, manganese, magnesium, chromium, zinc, lead, bismuth or nickel. The alloy may contain negligible impurities in addition to some iron and titanium.

The surface of aluminum plate is pretreated, if necessary, to remove rolling oil on the surface and lay bare a clean aluminum surface, prior to the graining procedure. For the former purpose, a solvent such as trichlene and a surfactant are used and, for the latter purpose, an alkali etching agent such as sodium hydroxide or potassium hydroxide is widely used.

Graining methods employable in the present invention include mechanical graining methods, chemical graining methods, and electrochemical graining methods (called electrolytic etching methods). Preferable mechanical graining methods include a wire brush-graining method of scratching the metal surface with a metal wire, a ball-graining method using abrasive balls and an abrasive, and a brush-graining method using a nylon brush and an abrasive. The brush-graining method is particularly preferable for graining the surface of aluminum plate continuously on a large scale. The brush-graining method is described in detail in, for example, U.S. Pat. No. 3,891,516 and Japanese Patent Publication No. 40047/75.

Graining by the above-described methods is preferably conducted to such degree that central line average roughness (Ra) of the surface of aluminum plate falls within the range of from 0.4 to $1.0\mu$.

The thus grained aluminum plate is, if necessary, washed with water and chemically etched.

Etching solutions used with the present invention are usually selected from aqueous solutions of bases or acids capable of dissolving aluminum. The etching solution must not form, on the etched surface, a film which is different from aluminum. Preferable etching agents include basic substances such as sodium hydroxide, potassium hydroxide, trisodium phosphate, disodium phosphate, tripotassium phosphate, dipotassium phosphate, etc., and acidic substances such as sulfuric acid, persulfuric acid, phosphoric acid, hydrochloric acid, and the salts thereof. However, salts of metals having lower ionization tendency than aluminum, such as zinc, chromium, cobalt, nickel, copper, etc., are not preferable, because they form unnecessary film on the etched surface.

In a determination of a concentration and a temperature of the etching agent, these etching agents are most preferably used in such manner that the dissolving rate of aluminum or alloy used becomes 0.3 $g/m^2$ to 40 $g/m^2$ per minute of dipping, with faster or slower rates also being possible.

Etching is conducted by dipping an aluminum plate in the above-described etching solution or by applying the etching solution to an aluminum plate, and is preferably effected to such degree that the etching amount falls within the range of from 0.5 to 10 $g/m^2$.

Due to the fast etching rate, the use of an aqueous solution of a basic substance is desirable. In this case, smut is usually produced, and hence the aluminum plate is desmutted. In desmutting treatment, an acid such as nitric acid, sulfuric acid, phosphoric acid, chromic acid, hydrofluoric acid, borofluoric acid, or the like is used.

An etched aluminum plate is, if necessary, washed with water, and anodized. Anodizing can be conducted in a manner having been employed in this field. Specifically, an oxide film can be formed on the surface of an aluminum support by conducting a direct or alternating current through the aluminum support in an aqueous or non-aqueous solution of one or more of sulfuric acid, phosphoric acid, chromic acid, oxalic acid, sulfamic acid, benzenesulfonic acid, etc.

Anodizing conditions cannot be definitely specified, because they vary depending upon an electrolytic solution used but, in general, the concentration of the electrolytic solution is 1 to 80 wt%, solution temperature is 5° to 70° C., current density is 0.5 to 60 $A/dm^2$, voltage is 1 to 100 v, and electrolysis time is 30 seconds to 50 minutes.

As a result, the anodizing conditions are determined so as to form aluminum oxide having a coverage ranging from 1 to 6 $g/m^2$ on an aluminum support.

Of the anodizing treatments, that described in British Pat. No. 1,412,768 in which anodizing is conducted in sulfuric acid at high current density and that described in U.S. Pat. No. 3,511,661 in which anodizing is conducted using phosphoric acid as an electrolytic bath are preferable.

A positive working light-sensitive composition of the present invention is provided on the thus processed support for the lithographic printing plate precursor. The composition preferably comprises an o-quinonediazide compound and a phenolic resin.

The o-quinonediazide compound to be used in the present invention is a compound having at least one o-quinonediazido group and showing increased alkali solution solubility by actinic radiation. Compounds of extremely diverse structures can be used as the o-quinonediazide compounds. Such o-quinonediazide compounds are described in detail in J. Kosar, *Light-Sensitive Systems* (John Wiley & Sons, Inc.), pp. 339–352 can can be used in the present invention. Particularly, o-quinonediazide sulfonic acid esters of sulfonamides obtained by reacting with various aromatic polyhydroxy compounds or amines are suitable.

Of the o-quinonediazide compounds to be used in the present invention, an ester between benzoquinone(1,2-)diazide-sulfonic acid chloride and polyhydroxyphenol or an ester between naphthoquinone(1,2)diazide-sulfonic acid chloride and pyrogallol-acetone resin, as described in Japanese Patent Publication No. 28403/68, are most preferable. Other preferable o-quinonediazide compounds include esters between benzoquinone(1,2-)diazide-sulfonic acid chloride or naphthoquinone(1,2-)diazide-sulfonic acid chloride and phenol-formaldehyde resin described in U.S. Pat. Nos. 3,046,120 and 3,188,210.

Other useful o-quinonediazide compounds have been reported in many patents. For example, such compounds are described in Japanese Patent Application (OPI) Nos. 5303/72, 63802/73, 63808/73, 96575/73, 38701/74, 13354/73 (the term "OPI" as used herein refers to a "published unexamined Japanese patent application"), Japanese Patent Publication Nos. 11222/66, 9610/70, 17481/74, U.S. Pat. Nos. 2,797,213, 3,454,400, 3,544,323, 3,573,917, 3,674,495, 3,785,825, British Pat. Nos. 1,227,602, 1,251,345, 1,267,005, 1,329,888, 1,330,932 and German Pat. No. 854,890.

The phenolic resin to be used in the present invention means novolak resins and polyvinyl compounds having phenolic hydroxy groups. Novolak resin is that obtained by condensing a phenol compound with a formaldehyde in the presence of an acidic catalyst, including those modified with xylene or mesitylene. Typical examples of such novolak resins include phenol-formaldehyde resin, cresol-formaldehyde resin, p-tert-butyl-phenol-formaldehyde resin and phenol-modified xylene resin.

Polyvinyl compounds having phenolic hydroxy groups include polyhydroxystyrene polymer and copolymer, and halogenated polyhydroxystyrene polymer and copolymer.

The amount of o-quinonediazide compound is 10 to 50 wt%, preferably 20 to 40 wt%, based on the total weight of the composition, and the amount of phenolic resin to be compounded is 45 to 79 wt%, preferably 50 to 70 wt%, based on the total weight of the composition.

The positive working light-sensitive composition to be used in the present invention contains an oxonol dye. Oxonol dyes represented by the following general formula (I) are preferred:

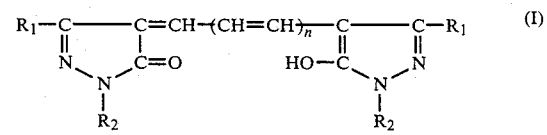

wherein $R_1$ and $R_2$, which may be the same or different, each represents a monovalent group selected from the group consisting of an optionally substituted aryl group, an optionally substituted lower alkyl group, and an optionally substituted alkoxycarbonyl group, and n represents 1 or 2.

Particularly preferred examples of the compound of the general formula (I) are those having structures shown in Table 1.

TABLE 1

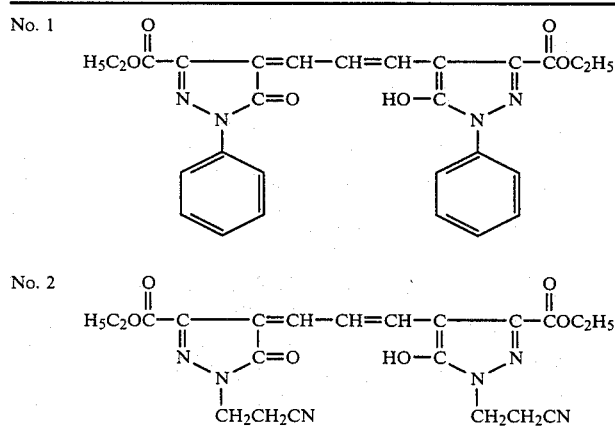

TABLE 1-continued

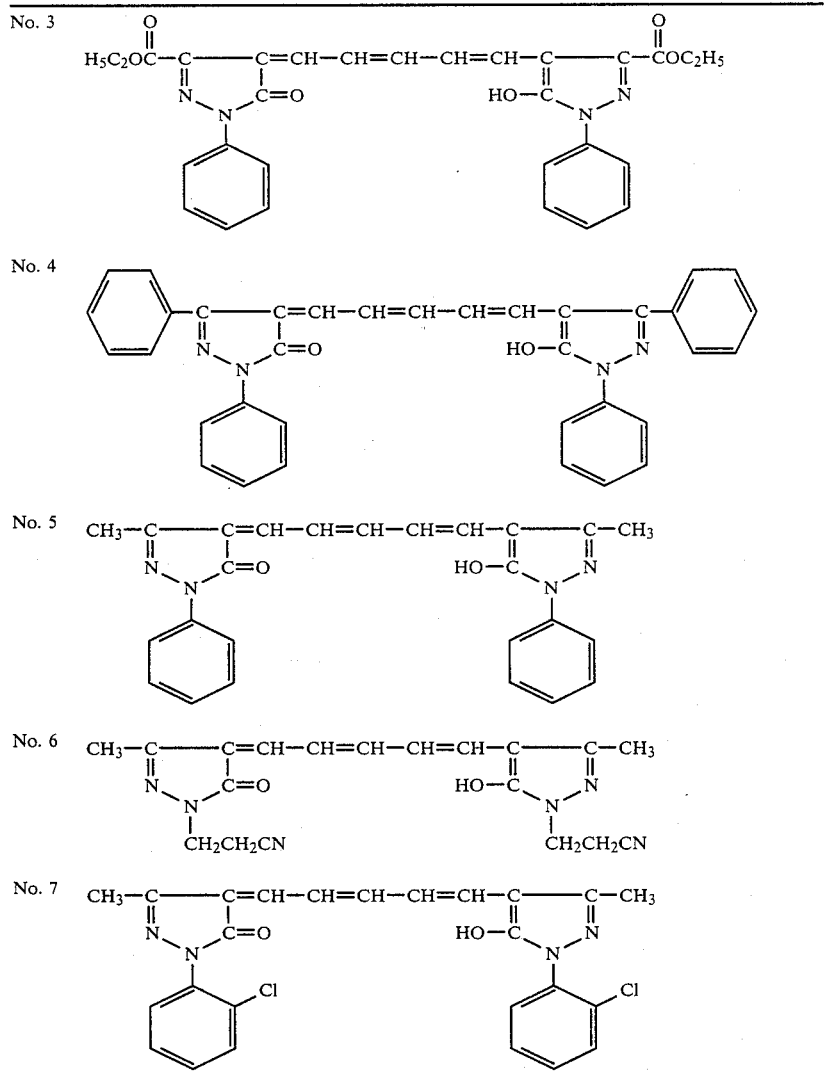

These oxonol dyes can be used alone or in combination. The amount of the dye to be added is preferably 0.3 to 15 wt%, more preferably 0.5 to 7 wt%, based on the total weight of the light-sensitive composition and, if necessary, the dye may be used together with other dyes or pigments.

It is possible to add to the positive working light-sensitive composition to be used in the present invention, compounds capable of producing a photolysis product which changes the color of an oxonol dye by mutual action therewith. Examples of such compounds include o-naphthoquinonediazide-4-sulfonic acid halides described in Japanese Patent Application (OPI) No. 36209/75, trihalomethyl-2-pyrones or trihalomethyltriazines described in Japanese Patent Application (OPI) No. 36223/78, various o-naphthoquinonediazide compounds described in Japanese Patent Application (OPI) No. 62444/80, and 2-trihalomethyl-5-aryl-1,3,4-oxadiazole compounds described in Japanese Patent Application (OPI) No. 77742/80. These compounds can be used alone or in combination, the amount to be added being preferably 0.3 to 15 wt%.

Sensitivity of the composition of the present invention can be raised by adding acid anhydrides described in Japanese Patent Application (OPI) No. 80022/77. In addition, various additives can be added to the composition for various purposes; for example, fillers, cellulose alkyl ethers and ethylene oxide type surfactants (e.g., FC-430 or FC-431 made by 3M) for improving coating properties, and plasticizers (e.g., dibutyl phthalate, butyl glycolate, tricresyl phosphate, dioctyl adipate, etc.) for improving physical properties of coated film, and the like. Addition of fillers further improves the physical properties of coated film and, in addition, makes it possible to mat the surface of a light-sensitive layer, which serves to improve vacuum adhesive properties upon printing image and prevents so-called defocusing upon printing. Useful fillers include talc powder, glass powder, clay, starch, wheat powder, corn powder and teflon powder.

The composition of the present invention is coated on a support by dissolving it in a solvent capable of dissolving the above-described ingredients. Examples of useful solvents include ethylene dichloride, cyclohexanone, methyl ethyl ketone, methyl cellosolve acetate, toluene, ethyl acetate, etc. They are used alone or in combination. The concentration of solids in the coating solution is suitably 2 to 50 wt%. With light-sensitive lithographic printing plates, the coating amount is suitably 0.5 to 3.0 g/m² as solids. As the coating amount decreases, light sensitivity is increased, with mechanical and chemical strength of light-sensitive film and physical properties such as development tolerance and ink receptivity being deteriorated.

Useful developing agents for the light-sensitive composition of the present invention include aqueous solutions of inorganic alkali agents such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate, aqueous ammonia, etc., and organic alkali agents such as monoethanolamine and diethanolamine. These are added in concentrations of 0.1 to 10 wt%, preferably 0.5 to 5 wt%.

To the alkaline aqueous solution may be added, if necessary, a surfactant and an organic solvent such as an alcohol.

The present invention will now be described in more detail by the following non-limiting examples of preferred embodiments of the present invention. Additionally, "%" in the following examples are all by weight unless otherwise specified.

| Light-Sensitive Solution | |
|---|---|
| sulfonyl chloride | |
| Dye (note 3) | |
| Methyl ethyl ketone | 8 g |
| 2-Methoxyethyl acetate | 15 g |

Note 1: that described in Example 1 of U.S. Pat. No. 3,635,709
Note 2: that described in U.S. Pat. No. 4,123,279
Note 3: Dye:

EXAMPLE 1

Oxonol of the following 0.07 g structure.

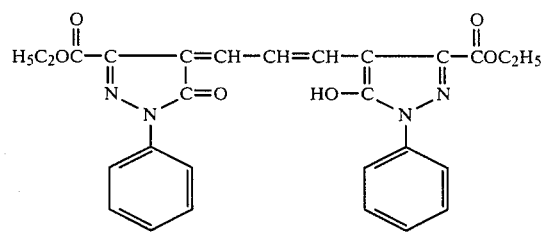

EXAMPLE 2

Oxonol dye of the 0.07 g following structure.

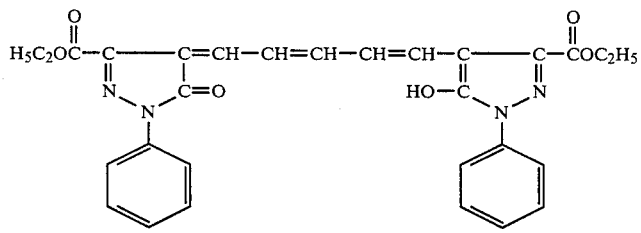

EXAMPLES 1 & 2 AND COMPARATIVE EXAMPLES a TO i

A 0.3 mm thick aluminum plate (grade: 1050) was degreased by washing with trichlene, and its surface was grained using a nylon brush and a 400 mesh pumice aqueous suspension, followed by washing with water. This plate was dipped for 9 seconds in a 25% sodium hydroxide aqueous solution kept at 45° C. to etch, then dipped in 20% nitric acid for 20 seconds. The amount of etching of the grained surface was about 3 g/m². This plate was then subjected to anodic oxidation at a current density of 15 A/dm² using 7% sulfuric acid as an electrolytic solution to form thereon 3 g/m² of an oxide film, followed by washing with water and drying. On this aluminum plate was coated each of the following light-sensitive solutions (Examples 1 and 2 and Comparative Examples a to i), followed by drying at 100° C. for 2 minutes to prepare positive working light-sensitive printing plate precursors 1, 2, and a to i. The dry coating amount was 2.4 to 2.5 g/m² in every case.

| Light-Sensitive Solution | |
|---|---|
| An ester compound between naphthoquinone-1,2-diazide-5-sulfonyl chloride and pyrogallol-acetate resin (note 1) | 0.90 g |
| Cresol-formaldehyde resin | 2.00 g |
| t-Butylphenol-formaldehyde resin (note 2) | 0.05 g |
| Naphthoquinone-1,2-diazide-4- | 0.03 g |

COMPARATIVE Example a

Crystal Violet 0.018 g (C.I. 42555).

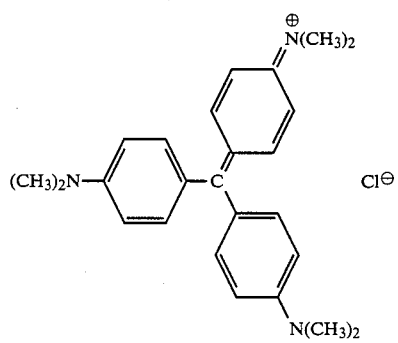

COMPARATIVE Example b

Malachite Green 0.045 g (C.I. 42000).

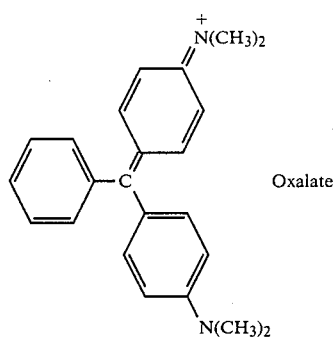

COMPARATIVE

Sumiplast Blue G 0.07 g (C.I. 61525).
Example c

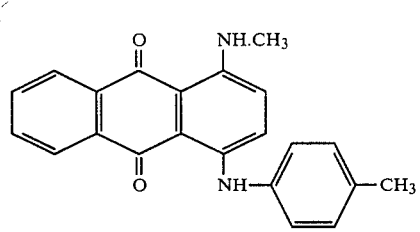

COMPARATIVE

Orient Oil Violet #730 0.06 g (C.I. 67025).
Example d

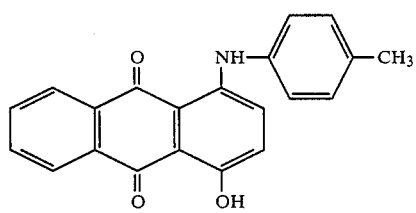

COMPARATIVE

Methylene Blue 0.10 g (C.I. 52015).
Example e

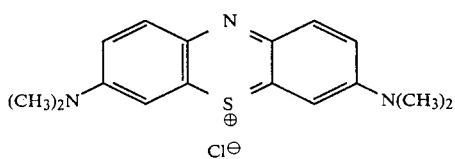

COMPARATIVE

Styryl dye of the 0.07 g following structure.
Example f

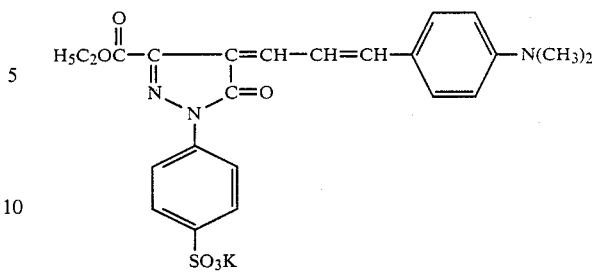

COMPARATIVE

Styryl dye of the 0.023 g following structure.
Example g

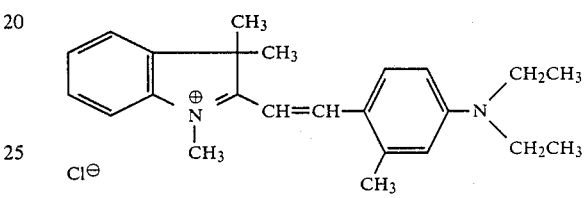

COMPARATIVE

Aminonaphthoquinone 0.20 g dye of the following structure.
Example h

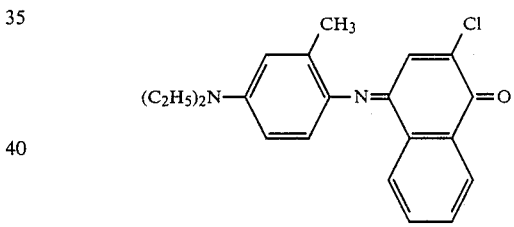

COMPARATIVE

Orient Oil Blue #603, 4.04 g (made by Orient Kagaku Kogyo Kabushiki Kaisha).
Example i Each of these positive working light-sensitive printing plate precursors was exposed using a 30 A carbon arc lamp spaced at a distance of 70 cm, and developed with a fresh developing solution prepared by diluting DP-1 (trade name of sodium silicate aqueous solution; made by Fugi Photo Film Co., Ltd.) six times, or with its fatigued solution in an automatic developing machine, or manually with a fresh solution to evaluate the plate precursors. The results thus obtained are tabulated in Table 2. Printing-out contrast (ΔD) is a value determined as [density in unexposed area—density in exposed area], color strain density as [density of developing solution in non-image area—density of light-sensitive layer-free aluminum support], and uneven manual development is determined by visually evaluating uneven development in the non-image area after manual development.

TABLE 2

Evaluation of Performance of Positive Working Light-Sensitive Printing Plate

| | Added Amount (g) | Density in Image Area (D) | Printing-Out Contrast (ΔD) | Density of Color Stain Fresh Soln. | Density of Color Stain Fatigued Soln. | Uneven Manual Development |
|---|---|---|---|---|---|---|
| Ex. 1 | 0.07 | 0.85 | 0.22 | 0 | 0.01 | o |
| Ex. 2 | 0.07 | 0.84 | 0.16 | 0 | 0.01 | o |
| Comp. Ex. a | 0.018 | 0.90 | 0.20 | 0.01 | 0.05 | x |
| Comp. Ex. b | 0.045 | 0.87 | −0.02 | 0.22 | 0.22 | o |
| Comp. Ex. c | 0.07 | 0.84 | 0 | 0.02 | 0.04 | Δ |
| Comp. Ex. d | 0.06 | 0.88 | −0.03 | 0.03 | 0.06 | x |
| Comp. Ex. e | 0.10 | 0.60 | 0.03 | 0.01 | 0.04 | x |
| Comp. Ex. f | 0.07 | 0.80 | 0.10 | 0.01 | 0.04 | x |
| Comp. Ex. g | 0.023 | 0.86 | 0.20 | 0.01 | 0.05 | x |
| Comp. Ex. h | 0.20 | 0.87 | 0.15 | 0.03 | 0.04 | o |
| Comp. Ex. i | 0.04 | 0.85 | 0.22 | 0.01 | 0.04 | x |

*o: No uneven development
Δ: Uneven development was seen at places
x: Uneven development was seen on overall plate Examples 1 and 2 provided positive working light-sensitive printing plates in accordance with the present invention, and Comparative Examples a to i used several known dyes.

In Examples 1 and 2, both fresh developing solution and fatigued solution produced less color stain, provided highly contrasty fine image, and caused no uneven development in manual development, thus good performance being obtained. In addition, printing-out properties are good, and the resulting plates showed good capability as printing plates and gave good prints.

On the other hand, in Comparative Examples a, c, d, e, f, g and i, fatigued solution produced serious color stain though fresh solution produced less color stain, fatigued solution provided low contrasty fine image and, in manual development, caused seriously uneven development in the non-image area. Comparative Examples b and h are good with respect to evenness in manual development due to less increase in color stain between fresh solution and fatigued solution but, since both fresh solution and fatigued solution cause much color stain, even fresh developing solution provides only a low contrasty fine image. The known dyes shown above are only part of tested dyes, but those dyes which cause less color stain in both fresh solution and fatigued solution were all found to be oxonol dyes.

EXAMPLE 3

A 0.24 mm thick 2S aluminum plate was dipped for 3 minutes in a 10% sodium tertiary phosphate aqueous solution kept at 80° C. to degrease, grained by a nylon brush, and dipped in a 25% sodium hydroxide aqueous solution of 45° C. for 20 seconds to etch. After washing, the aluminum plate was desmutted with a 3% aqueous solution of sodium hydrogensulfate. This aluminum plate was subjected to anodic oxidation in 15% sulfuric acid at a direct current density of 20 A/dm$^2$ to provide thereon an oxide film, then washed with water and dried. The following light-sensitive solution was coated on this aluminum plate and dried at 100° C. for 2 minutes.

| | |
|---|---|
| An ester compound between naphthoquinone(1,2)diazide(2)-5-sulfonyl chloride and pyrogallol-acetone resin | 0.85 g |
| Cresol-formaldehyde resin | 2.10 g |
| Hexahydrophthalic anhydride | 0.15 g |
| o-Naphthoquinonediazide-4-sulfonyl chloride | 0.02 g |
| 2-(p-Methoxystyryl)-4,6-bis(trichloromethyl)-s-triazine | 0.01 g |
| Ethylene dichloride | 16 g |
| 2-Methoxyethyl acetate | 12 g |
| Oxonol dye | 0.07 g |

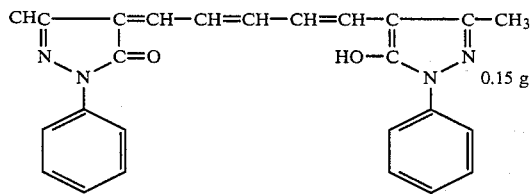

When exposure and development were conducted in the same manner as in Examples 1 and 2, both fresh developing solution and fatigued developing solution caused less color stain, no uneven development in manual development, and provided a highly contrasty fine image, thus resulting plates being easily inspected. Other printing capabilities were also satisfactory, and good prints were obtained.

EXAMPLE 4

A light-sensitive printing plate was obtained in the same manner as in Example 3 except for changing the oxonol dye to the following one:

$$\text{CHC}-\overset{\text{C}=\text{CH}-\text{CH}=\text{CH}-\text{CH}=\text{CH}-\text{C}-\text{C}-\text{CH}_3}{\underset{\text{N}\diagdown_{\text{N}}\diagup\text{C}=\text{O}}{\|}} \quad \underset{\text{HO}-\text{C}\diagdown_{\text{N}}\diagup\text{N}}{\|}$$

0.15 g

In this case, too, less color stain was formed after development, and no uneven development resulted by manual development, thus good results were obtained.

While the invention has been described in detail and with reference to specific embodiments thereof, it will be apparent to one skilled in the art that various changes and modifications can be made therein without departing from the spirit and scope thereof.

What is claimed is:

1. In a light-sensitive printing plate precursor capable of forming a positive working lithographic printing plate having high color stain resistance and high image contrast, comprising:
    an aluminum support base having a grained and anodized surface; and
    a positive working light-sensitive composition comprising an o-quinonediazide compound in admixture with a dye provided on said surface, said o-quinonediazide compound being present in an amount of 10 to 50 wt % based on the total weight of said composition;

the improvement is characterized in that said dye comprises an oxonol dye, which provides the stain resistance and the contrast upon light image exposure and development, present in an amount of 0.3 to 15 wt % based on the total weight of said composition.

2. A light-sensitive printing plate precursor as claimed in claim 1, wherein the oxonol dye is a dye represented by the general formula (I):

wherein $R_1$ and $R_2$, which may be the same or different, each represents a hydrogen atom or a monovalent group selected from the group consisting of a substituted or unsubstituted aryl group, a substituted or unsubstituted lower alkyl group, a substituted or unsubstituted alkoxycarbonyl group, and a carboxy group, and n represents 1 or 2.

3. A light-sensitive printing plate precursor as claimed in claim 2, wherein said oxonol dye is selected from the group consisting of:

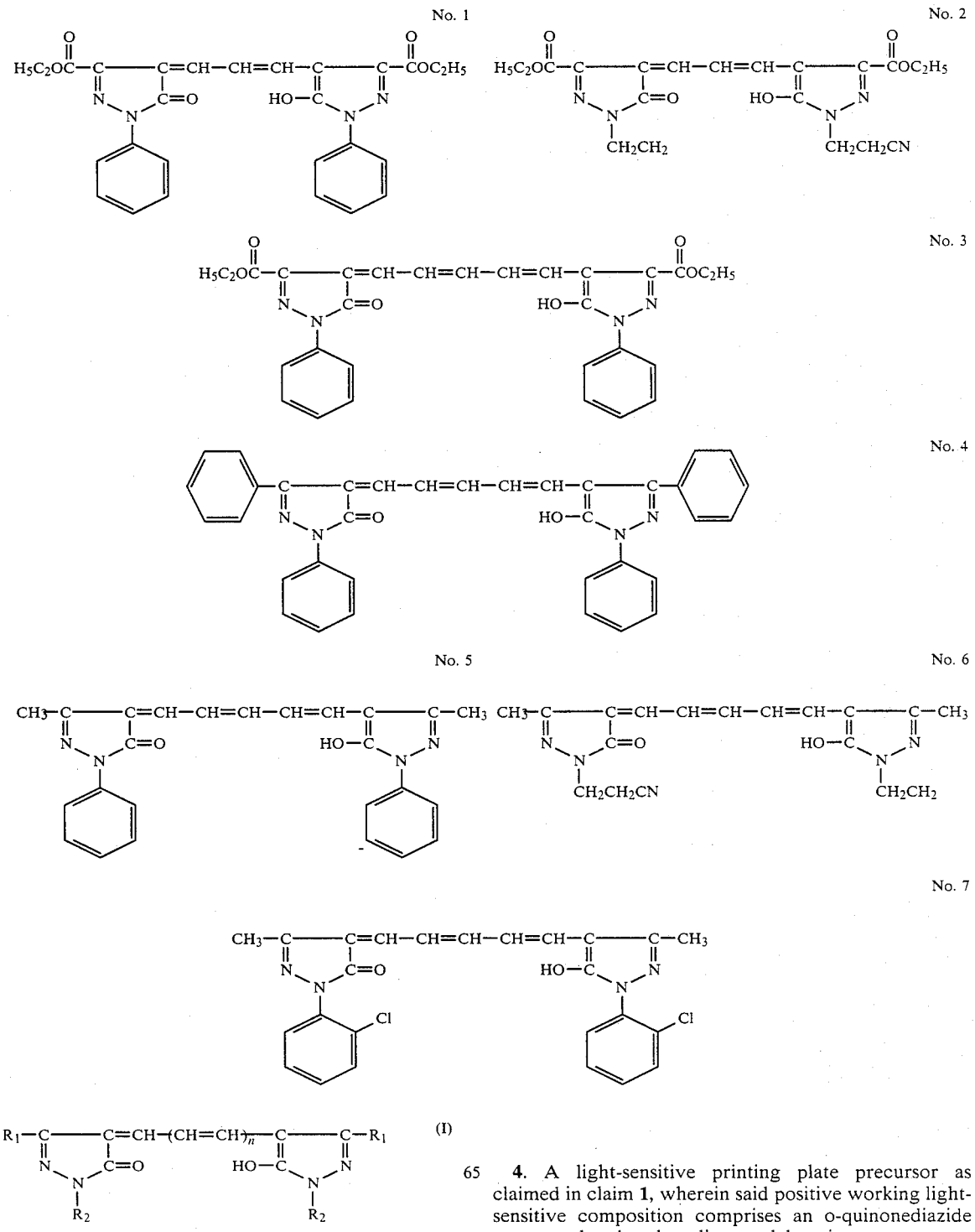

4. A light-sensitive printing plate precursor as claimed in claim 1, wherein said positive working light-sensitive composition comprises an o-quinonediazide compound and a phenolic novolak resin.

5. A light-sensitive printing plate precursor as claimed in claim 1, wherein said aluminum support is anodized so as to form aluminum oxide having a coverage ranging from 1 to 6 g/m².

6. A light-sensitive printing plate precursor as claimed in claim 1, wherein the oxonol dye is present in the layer coated on the surface in an amount in the range of 0.5 to 7 wt% based o the total weight of the layer.

* * * * *